(12) United States Patent
Koop

(10) Patent No.: US 9,024,630 B2
(45) Date of Patent: May 5, 2015

(54) MAGNETIC FIELD SENSOR AND METHOD FOR MANUFACTURING A MAGNETIC FIELD SENSOR

(71) Applicant: Paul Koop, Stuttgart (DE)

(72) Inventor: Paul Koop, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 157 days.

(21) Appl. No.: 13/765,381

(22) Filed: Feb. 12, 2013

(65) Prior Publication Data

US 2013/0207650 A1    Aug. 15, 2013

(30) Foreign Application Priority Data

Feb. 14, 2012  (DE) .......................... 10 2012 202 179

(51) Int. Cl.
| | |
|---|---|
| *G01R 33/07* | (2006.01) |
| *H05K 3/30* | (2006.01) |
| *H05K 1/18* | (2006.01) |
| *G01R 33/00* | (2006.01) |

(52) U.S. Cl.
CPC .............. *G01R 33/072* (2013.01); *H05K 3/30* (2013.01); *H05K 1/18* (2013.01); *H05K 2201/09072* (2013.01); *H05K 2201/10151* (2013.01); *H05K 2201/10545* (2013.01); *G01R 33/0011* (2013.01)

(58) Field of Classification Search
USPC ............... 324/200, 207.46, 207.35, 244, 174, 324/117 H, 117 R, 251
See application file for complete search history.

(56) References Cited

U.S. PATENT DOCUMENTS

| | | | | |
|---|---|---|---|---|
| 4,893,073 | A * | 1/1990 | McDonald et al. | 324/117 H |
| 5,883,567 | A | 3/1999 | Mullins, Jr. | |
| 6,501,268 | B1 * | 12/2002 | Edelstein et al. | 324/244 |
| 7,358,724 | B2 | 4/2008 | Taylor et al. | |
| 7,545,136 | B2 * | 6/2009 | Racz et al. | 324/117 H |
| 7,936,164 | B2 * | 5/2011 | Doogue et al. | 324/117 H |
| 2010/0188078 | A1 * | 7/2010 | Foletto et al. | 324/251 |
| 2010/0271018 | A1 * | 10/2010 | Clinton | 324/252 |

* cited by examiner

*Primary Examiner* — Arleen M Vazquez
*Assistant Examiner* — Nasima Monsur
(74) *Attorney, Agent, or Firm* — Kenyon & Kenyon LLP

(57) ABSTRACT

A magnetic field sensor includes: a circuit board having a first surface, a second surface opposite to the first surface, and a recess extending from the first surface to the second surface; a Hall sensor component having a Hall sensor situated in a housing, the Hall sensor component having an active sensor area situated parallel to the first surface and in the area of the recess on the side of the second surface on the circuit board; and a first magnetic flux concentrator made of a magnetically permeable material and situated on the side of the first surface opposite to the Hall sensor component, the magnetic flux concentrator having a lateral surface which faces away from the circuit board and includes a first surface area and a lateral surface which faces toward the circuit board and includes a second surface area which is smaller than the first surface area.

11 Claims, 4 Drawing Sheets

MAGNETIC FIELD SENSOR AND METHOD FOR MANUFACTURING A MAGNETIC FIELD SENSOR

BACKGROUND OF THE INVENTION

1. Field of the Invention

The present invention relates to a magnetic field sensor and a method for manufacturing a magnetic field sensor, e.g., in the case of equipping Hall sensors in SMD housings with magnetic flux concentrators.

2. Description of the Related Art

In many applications, it is necessary or desirable to measure the magnetic field of the surroundings. Various sensors may be used. Hall sensors are frequently used, which generate an electrical voltage or an electrical current as an output signal on the basis of the Hall effect of a conductor loop permeated by a magnetic flux. These Hall sensors may be housed for large-scale mass production in surface-mounted housings (SMD housing "surface-mounted devices"). In particular, multiple Hall sensors may be integrated within a housing, for example, for differential magnetic field measurements.

Magnetic fields in very small amounts may be measured using Hall sensors. For this purpose, it may be advantageous to concentrate the magnetic flux via a specific area and conduct it through the active area of the Hall sensor. An amplification of the magnetic field via the active area of the Hall sensor may thus be achieved.

For example, a magnetic flux concentrator made of a material of high magnetic permeability is integrated into a semiconductor housing above a Hall sensor in U.S. Pat. No. 5,883,567 A. U.S. Pat. No. 7,358,724 B2 discloses a magnetic field sensor having a Hall sensor and a recess located above the Hall sensor in a semiconductor substrate, on whose side walls a layer, which concentrates the magnetic flux, made of a material of high magnetic permeability is applied.

There is therefore a demand for magnetic field sensors, using which a magnetic flux may be bundled via the active area of the Hall sensor integrated therein. A cost-effective implementation is desired in particular, which may be implemented with little additional outlay in large-scale mass production in the manufacture of the magnetic field sensors.

BRIEF SUMMARY OF THE INVENTION

According to one aspect, the present invention provides a magnetic field sensor having a circuit board having a first surface, a second surface opposite to the first surface, and a recess extending from the first surface to the second surface, a Hall sensor component, which has a housing and at least one Hall sensor, which is situated in the housing, having an active sensor area situated parallel to the first surface, and which is situated in the area of the recess on the side of the second surface on the circuit board, and a first magnetic flux concentrator made of magnetically permeable material, which is arranged on the side of the first surface on the circuit board opposite to the Hall sensor component, and which has a lateral surface, which faces away from the circuit board, having a first surface area and a lateral surface, which faces toward the circuit board, having a second surface area, the first surface area being greater than the second surface area.

According to another aspect, the present invention provides a method for manufacturing a magnetic field sensor, having the steps of mounting a Hall sensor component, which has a housing and at least one Hall sensor situated in the housing, on a circuit board having a first surface, a second surface opposite to the first surface, and a recess extending from the first surface to the second surface, in the area of the recess on the side of the second surface, and mounting a first magnetic flux concentrator made of a magnetically permeable material on the side of the first surface on the circuit board opposite to the Hall sensor component, the magnetic flux concentrator having a lateral surface, which faces away from the circuit board, having a first surface area and having a lateral surface, which faces toward the circuit board, having a second surface area, and the first surface area being greater than the second surface area.

It is an idea of the present invention to provide a magnetic flux concentrator for a Hall sensor, which may be assembled on a circuit board using SMD technology. The magnetic flux concentrator amplifies the magnetic field via an active area of a Hall sensor. In particular, an integration into a large-scale mass production line is made possible using this magnetic flux concentrator, without complex integration of the magnetic flux concentrator into the design of the Hall sensor being necessary.

A significant advantage of this magnetic field sensor is that the Hall sensors used in the magnetic field sensor may achieve a higher resolution and an improved signal-to-noise ratio. In addition, the electromagnetic compatibility (EMC) of the magnetic field sensor may be improved if the magnetic flux concentrator is connected to the ground potential of the magnetic field sensor.

According to one specific embodiment of the magnetic field sensor according to the present invention, the first magnetic flux concentrator may have a trapezoidal cross-sectional area. According to one alternative specific embodiment of the magnetic field sensor according to the present invention, the first magnetic flux concentrator may have a cross-sectional area which corresponds to a longitudinal section through one half of a single-sheet hyperboloid. These shapes allow effective bundling of the magnetic flux via the active sensor area of the Hall sensor, in particular since the first magnetic flux concentrator having the specified shapes may extend into the recess. The advantage thus results that the structure of the magnetic field sensor as a whole remains flat, without the efficiency of the bundling of the magnetic flux being impaired.

According to another specific embodiment of the magnetic field sensor according to the present invention, the second surface area of the lateral surface of the first magnetic flux concentrator facing toward the circuit board may correspond to the surface area of the active sensor area of the Hall sensor. Effective amplification of the magnetic field via the Hall sensor is thus possible.

According to another specific embodiment of the magnetic field sensor according to the present invention, the Hall sensor component may have at least two adjacent Hall sensors situated along the second surface of the circuit board, and the lateral surface of the first magnetic flux concentrator facing toward the circuit board may be situated above the active sensor area of one of the two Hall sensors. This structure advantageously facilitates a differential analysis of the output signals of the two Hall sensors.

According to another specific embodiment of the magnetic field sensor according to the present invention, the first magnetic flux concentrator may be fastened on the first surface of the circuit board using solder contacts. This offers the advantage that the mounting of the magnetic field concentrator may be incorporated simply and cost-effectively in the assembly process of the circuit boards.

According to another specific embodiment of the magnetic field sensor according to the present invention, the magnetic field sensor may also include a second magnetic flux concentrator made of a magnetically permeable material, which is situated on the side of the second surface on the circuit board in such a way that the Hall sensor component is situated along the extension of the recess between the first magnetic flux concentrator and the second magnetic flux concentrator, the second magnetic flux concentrator having a lateral surface which faces away from the circuit board, having a third surface area and a lateral surface which faces toward the circuit board, having a fourth surface area, and the third surface area being greater than the fourth surface area. More extensive optimization of the magnetic flux by the Hall sensor or sensors is thus possible.

According to another specific embodiment of the method according to the present invention, the method may also include the step of installing a second magnetic flux concentrator made of a magnetically permeable material on the side of the second surface on the circuit board, so that the Hall sensor component is situated along the extension of the recess between the first magnetic flux concentrator and the second magnetic flux concentrator, the second magnetic flux concentrator having a lateral surface which faces away from the circuit board, having a third surface area and a lateral surface which faces toward the circuit board, having a fourth surface area, and the third surface area being greater than the fourth surface area.

Further features and advantages of specific embodiments of the present invention result from the following description with reference to the appended drawings.

The described designs and refinements may be combined with one another as desired, if meaningful. Furthermore possible designs, refinements, and implementations of the present invention also include combinations which are not explicitly mentioned of features of the present invention described above or hereafter with respect to the exemplary embodiments.

The appended drawings are to provide greater understanding of the specific embodiments of the present invention. They illustrate specific embodiments and are used in conjunction with the description to explain principles and concepts of the present invention. Other specific embodiments and many of the mentioned advantages result in view of the drawings. The elements of the drawings are not necessarily shown to scale with one another.

DETAILED DESCRIPTION OF THE INVENTION

Figure 1:
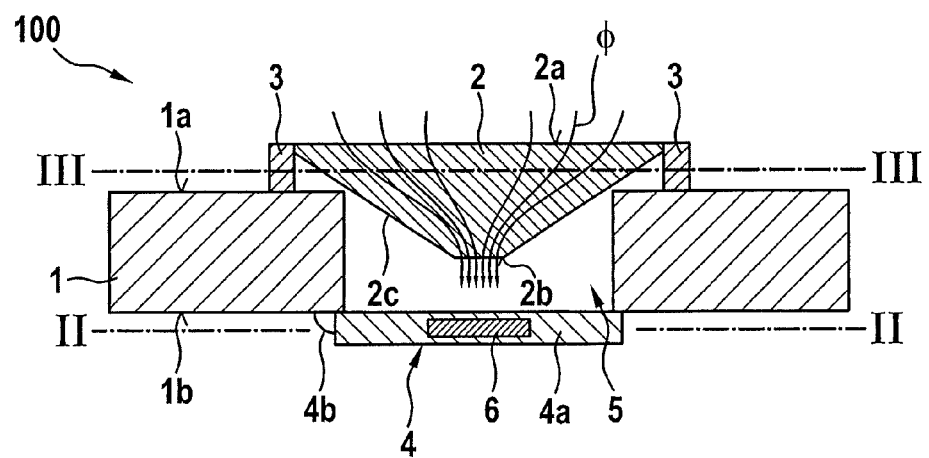
FIG. 1 shows a schematic illustration of a magnetic field sensor having a magnetic flux concentrator in cross section according to one specific embodiment.

FIG. 1 shows a schematic illustration of a magnetic field sensor 100 having a magnetic flux concentrator 2 in cross section. Magnetic field sensor 100 includes a circuit board 1 having a recess 5, a Hall sensor component 4, which is applied to circuit board 1 in the area of recess 5, and a magnetic flux concentrator 2 made of a magnetically permeable material, which is situated on circuit board 1 on the side opposite to Hall sensor component 4.

Circuit board 1 has a first surface 1a and a second surface 1b, which is opposite to first surface 1a. Recess 5 extends from first surface 1a to second surface 1b through circuit board 1. The shape and the dimensions of recess 5 may vary. For example, the cross-sectional area of recess 5 may be circular, rectangular, or rectangular with rounded edges. Recess 5 itself may have a congruent shape on both sides of the circuit board, for example.

Circuit board 1 may have a circuit board, for example, which is suitable for surface mounting (SMD circuit board). For example, circuit board 1 may include an FR circuit board, a prepreg circuit board, an HDI (high density interconnect) circuit board, or similar structural shapes.

Hall sensor component 4 includes a housing 4a, for example, an SO housing ("small outline"), and at least one sensor chip situated in housing 4a. The sensor chip may be a Hall sensor 6, for example, which has an active sensor area situated parallel to first surface 1a. Hall sensor component 4 may be applied to second surface 1b of circuit board 1 above the recess, for example. Alternatively thereto, Hall sensor component 4 may also be partially or entirely embedded in the recess. For this purpose, Hall sensor component 4 having housing 4a may be connected via a contact wire 4b or contact pins 4b to circuit board 1. Contact pins 4b may be connected for this purpose via solder contacts (not shown in FIG. 1) to second surface 1b of the circuit board using SMD technology.

Magnetic flux concentrator 2 may be made of a magnetically permeable material such as iron, cobalt, nickel, ferrites, or combinations or alloys of these materials. The material of magnetic flux concentrator 2 preferably has a very high coefficient of magnetic permeability. Magnetic flux concentrator 2 is situated on the side of first surface 1a on circuit board 1 opposite to Hall sensor component 4. The structural shape of magnetic flux concentrator 2 is generally funnel-shaped, i.e., a lateral surface 2a which faces away from circuit board 1, has a first surface area, which is greater than a second surface area of a lateral surface 2b of magnetic flux concentrator 2, which faces toward circuit board 1. Outer wall 2c of the funnel is beveled in the example of FIG. 1. The inclination of outer wall 2c may be selected in such a way that a lateral surface 2b of magnetic flux concentrator 2 extends as far as possible into recess 5, or lateral surface 2b of magnetic flux concentrator 2 is situated as closely as possible above the active sensor area of Hall sensor 6. In the example of FIG. 1, magnetic flux concentrator 2 therefore has a trapezoidal cross-sectional area.

Magnetic flux concentrator 2 may be fastened on first surface 1a of circuit board 1 using solder contacts 3. The shape of magnetic flux concentrator 2 is preferably such that lateral surface 2a of magnetic flux concentrator 2 is located as close as possible to first surface 1a of the circuit board, to ensure a compact and in particular flat structural shape of magnetic field sensor 100.

The second surface area of lateral surface 2b of magnetic flux concentrator 2 facing toward circuit board 1 may correspond to the surface area of the active sensor area of Hall sensor 6, so that—as indicated in FIG. 1 by magnetic flux lines Φ—the magnetic flux of the surrounding magnetic field may be bundled toward the active sensor area of Hall sensor 6. An effective amplification of the magnetic field via Hall sensor 6 may thus be made possible.

Figure 2:
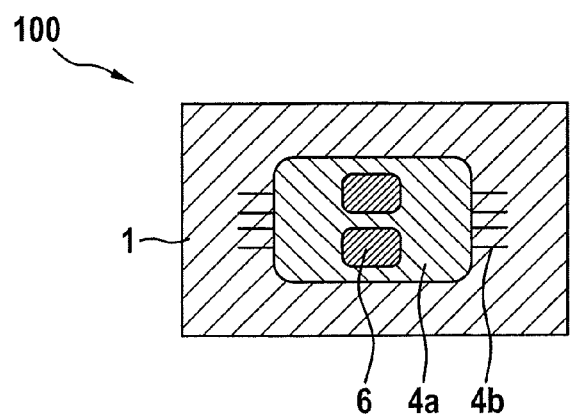
FIG. 2 shows a schematic illustration of the magnetic field sensor from FIG. 1 as viewed from below.
Figure 3:
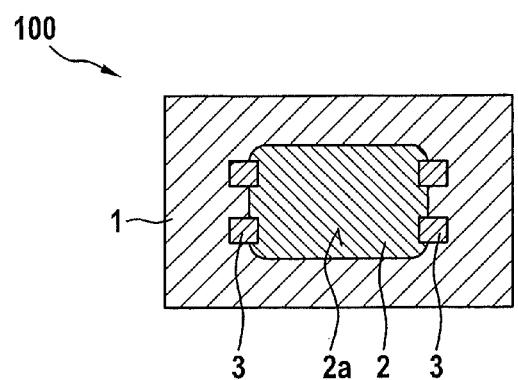
FIG. 3 shows a schematic illustration of the magnetic field sensor from FIG. 1 as viewed from above.

Two section lines are indicated in FIG. 1 by reference numerals II-II and III-III, which indicate the top view onto circuit board 1 from second surface 1b and first surface 1a. Schematic illustrations of these top views are shown in each case in FIGS. 2 and 3. FIG. 2 shows a schematic illustration of magnetic field sensor 100 from FIG. 1 in top view from below, while FIG. 3 shows a schematic illustration of magnetic field sensor 100 from FIG. 1 in top view from above.

Hall sensor component 4 may have, for example, at least two adjacent Hall sensors 6 situated along second surface 1b of circuit board 1. Lateral surface 2b of magnetic flux concentrator 2 facing toward circuit board 1 may be situated above the active sensor area of one of the two Hall sensors 6. Using this arrangement, the magnetic flux is only amplified via one of the two Hall sensors 6, so that differential measurements using the two Hall sensors 6 are made possible.

Neither the number of Hall sensors 6 nor the number of wire contacts 4b are restricted to the illustration shown as an example in FIG. 2, but rather may also assume other values. The cross-sectional form of Hall sensor component 4 is also not restricted to the illustration shown as an example in FIG. 2. Any other structural shape of housing 4a is also conceivable.

Figure 4:
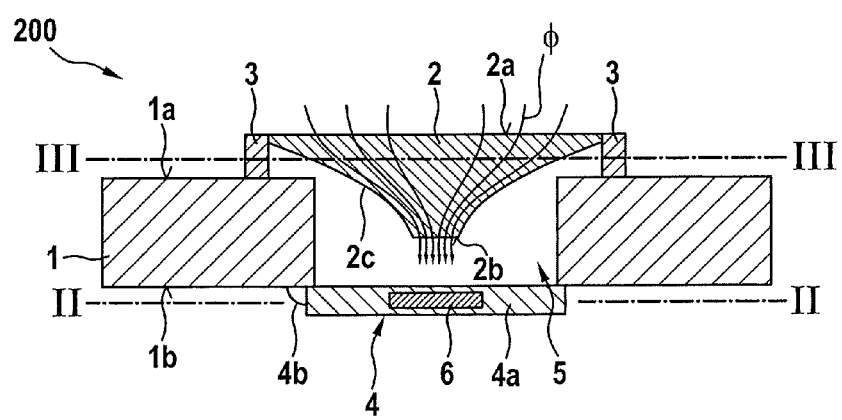
FIG. 4 shows a schematic illustration of a magnetic field sensor having a magnetic flux concentrator in cross section according to another specific embodiment.

FIG. 4 shows a schematic illustration of a magnetic field sensor 200 having a magnetic flux concentrator 2 in cross section according to an alternative exemplary embodiment. Magnetic field sensor 200 of FIG. 4 differs from magnetic field sensor 100 of FIG. 1 essentially in that magnetic flux concentrator 2 has a cross-sectional area which corresponds to a longitudinal section through one half of a single-sheet hyperboloid, i.e., outer wall 2c of the funnel of magnetic flux concentrator 2 has a concave arc line. Second lateral surface 2b may thus plunge more deeply into recess 5 or recess 5 may be scaled down laterally with equal (flat) structural height of magnetic flux concentrator 2.

Figure 5:
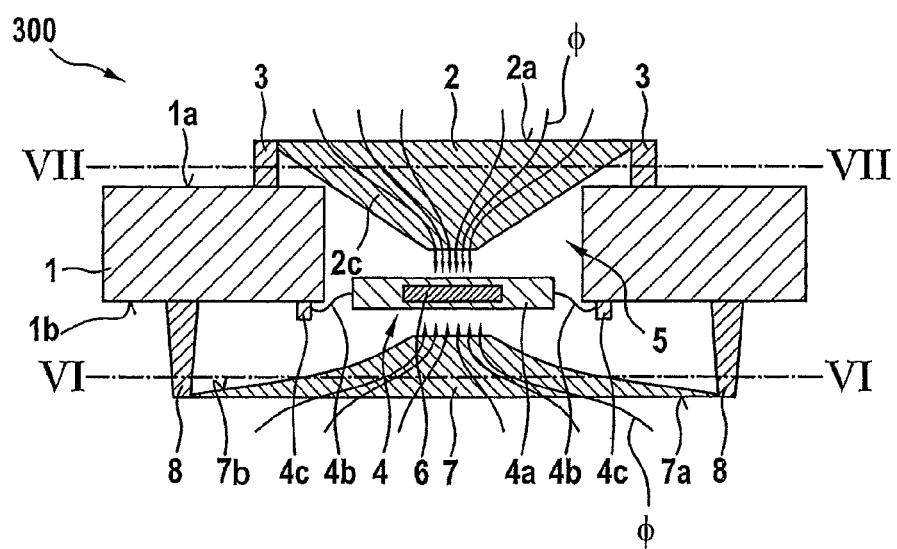
FIG. 5 shows a schematic illustration of a magnetic field sensor having two magnetic flux concentrators in cross section according to another specific embodiment.
Figure 6:
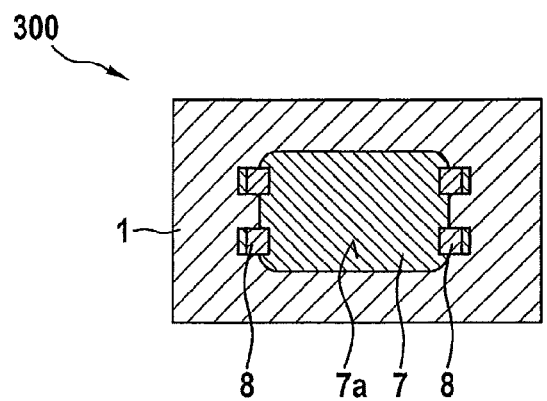
FIG. 6 shows a schematic illustration of the magnetic field sensor from FIG. 5 as viewed from below.
Figure 7:
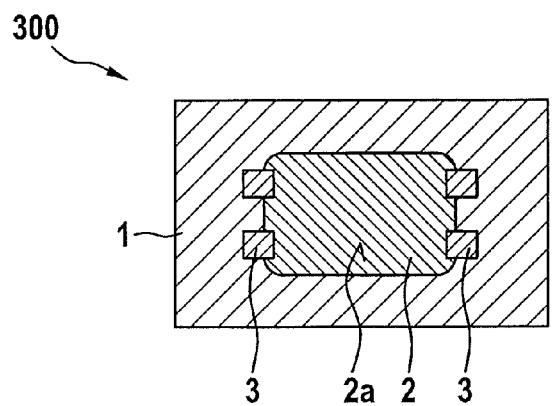
FIG. 7 shows a schematic illustration of the magnetic field sensor from FIG. 5 as viewed from below.

FIG. 5 shows a schematic illustration of a magnetic field sensor 300 having a first magnetic flux concentrator 2 and a second magnetic flux concentrator 7 in cross section. FIGS. 6 and 7 each show schematic illustrations of magnetic field sensor 300 from FIG. 5 in top view from above and below, respectively, as indicated by section lines VI-VI and VII-VII in FIG. 5. Magnetic field sensor 300 of FIG. 5 differs from magnetic field sensor 100 of FIG. 1 essentially in that the magnetic field sensor additionally has a second magnetic flux concentrator 7 made of a magnetically permeable material, which is situated on the side of second surface 1b on circuit board 1 in such a way that Hall sensor component 4 is situated along the extension of recess 5 between first magnetic flux concentrator 2 and second magnetic flux concentrator 7.

Second magnetic flux concentrator 7 may have a lateral surface 7a, which faces away from circuit board 1, having a third surface area and a lateral surface 7b, which faces toward circuit board 1, having a fourth surface area, so that the third surface area is greater than the fourth surface area. Overall, the construction of second magnetic flux concentrator 7 may essentially correspond to the construction of first magnetic flux concentrator 2. In particular, the outer shape and the selection of the magnetically permeable construction materials may be oriented to the particular parameters for first magnetic flux concentrator 2.

The arrangement of Hall sensor component 4 in FIG. 5 is selected in such a way that Hall sensor 6 is embedded in recess 5, i.e., the active sensor area of Hall sensor 6 is situated inside recess 5 between first surface 1a and second surface 1b of circuit board 1. For this purpose, for example, contact pins 4b of Hall sensor component 4 may be bent in "reverse," i.e., bent in such a way that they protrude beyond the lower side of Hall sensor component 4, as shown in FIG. 5. Subsequently, bent contact pins 4b of Hall sensor component 4 may be fastened using solder contacts 4c on second surface 1b of circuit board 1.

Second magnetic flux concentrator 7 may also be fastened via solder contacts 8 on second surface 1b of circuit board 1 using SMD technology. With the aid of second magnetic flux concentrator 7, in a similar way as using first magnetic flux concentrator 2, magnetic flux Φ may be bundled on the side of the active sensor area of Hall sensor 6 opposite to first magnetic flux concentrator 2. The permeation of Hall sensor 6 by the magnetic field to be measured may thus be further optimized.

Figure 8:
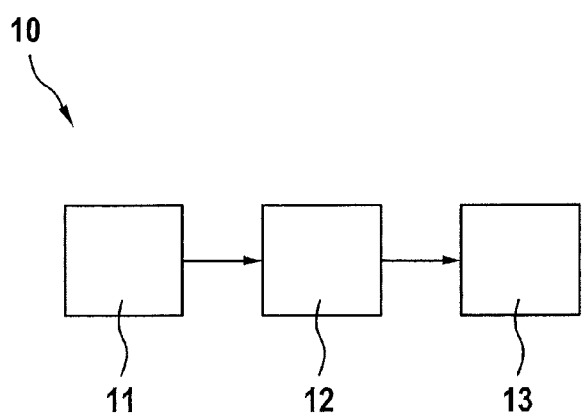
FIG. 8 shows a schematic illustration of a method for manufacturing a magnetic field sensor according to another specific embodiment.

FIG. 8 shows a schematic illustration of a method 10 for manufacturing a magnetic field sensor, in particular a magnetic field sensor 100, 200, or 300 shown in conjunction with FIGS. 1 through 7. Method 10 includes, in a first step 11, mounting of a Hall sensor component 4, which has a housing 4a and at least one Hall sensor 6 situated in housing 4a, on a circuit board 1 having a first surface 1a, a second surface 1b opposite to first surface 1a, and a recess 5 extending from first surface 1a to second surface 1b, in the area of recess 5 on the side of second surface 1b. The mounting of Hall sensor component 4 may take place in a surface-mounting step (SMD technology), for example.

In a second step 12, mounting of a first magnetic flux concentrator 2 made of a magnetically permeable material takes place on the side of first surface 1a on circuit board 1 opposite to Hall sensor component 4, magnetic flux concentrator 2 having a lateral surface 2a, which faces away from circuit board 1 having a first surface area and a lateral surface 2b which faces toward circuit board 1 having a second surface area, and the first surface area being greater than the second surface area.

Optionally, in a third step 13, mounting 13 of a second magnetic flux concentrator 7 made of a magnetically permeable material may take place on the side of second surface 1b on circuit board 1, so that Hall sensor component 4 is situated along the extension of recess 5 between first magnetic flux concentrator 2 and second magnetic flux concentrator 7, second magnetic flux concentrator 7 having a lateral surface 7a which faces away from circuit board 1, having a third surface area and a lateral surface 7b which faces toward circuit board 1, having a fourth surface area, and the third surface area being greater than the fourth surface area.

Steps 12 and 13 may preferably also be carried out using SMD technology, in that first and second magnetic flux concentrators 2 and 7 are fastened via solder contacts 3 and 8, respectively, on circuit board 1.

The above-explained magnetic field sensors and their manufacturing methods may be used, for example, in all applications in which a magnetic field is to be detected in a spatially resolved way. These magnetic field sensors are particularly advantageous in applications in which magnetic fields having small absolute values are to be ascertained, for example, in torque sensors, for example, for electric power steering, wireless torque sensors, current sensors, location detection sensors, compass applications, for contactless signal generators, or in similar cases.

What is claimed is:

1. A magnetic field sensor, comprising:
   a circuit board having a first surface, a second surface opposite to the first surface, and a recess extending from the first surface to the second surface; and
   a Hall sensor component having a housing and at least one Hall sensor situated in the housing, wherein the Hall sensor has an active sensor area which is situated parallel to the first surface and in the area of the recess on the side of the second surface on the circuit board; and
   a first magnetic flux concentrator made of a magnetically permeable material and situated on the side of the first surface on the circuit board opposite to the Hall sensor component, wherein the first magnetic flux concentrator has a first lateral surface which faces away from the circuit board and includes a first surface area and a second lateral surface which faces toward the circuit board and includes a second surface area, and wherein the first magnetic flux concentrator has a cross-sectional area which corresponds to a longitudinal section through one-half of a single-sheet hyperboloid.

2. The magnetic field sensor as recited in claim 1, wherein the second surface area of the second lateral surface of the magnetic flux concentrator facing toward the circuit board corresponds to the surface area of the active sensor area of the Hall sensor.

3. A magnetic field sensor, comprising:
   a circuit board having a first surface, a second surface opposite to the first surface, and a recess extending from the first surface to the second surface; and
   a Hall sensor component having a housing and at least one Hall sensor situated in the housing, wherein the Hall sensor has an active sensor area which is situated parallel to the first surface and in the area of the recess on the side of the second surface on the circuit board; and
   a first magnetic flux concentrator made of a magnetically permeable material and situated on the side of the first surface on the circuit board opposite to the Hall sensor component, wherein the first magnetic flux concentrator has a first lateral surface which faces away from the circuit board and includes a first surface area and a second lateral surface which faces toward the circuit board and includes a second surface area, and wherein the first surface area is greater than the second surface area;
   wherein the second surface area of the second lateral surface of the magnetic flux concentrator facing toward the circuit board corresponds to the surface area of the active sensor area of the Hall sensor, and
   wherein the Hall sensor component has at least two adjacent Hall sensors situated along the second surface of the circuit board, and wherein the lateral surface of the first magnetic flux concentrator facing toward the circuit board is situated above the active sensor area of one of the two Hall sensors.

4. A magnetic field sensor, comprising:
   a circuit board having a first surface, a second surface opposite to the first surface, and a recess extending from the first surface to the second surface; and
   a Hall sensor component having a housing and at least one Hall sensor situated in the housing, wherein the Hall sensor has an active sensor area which is situated parallel to the first surface and in the area of the recess on the side of the second surface on the circuit board; and
   a first magnetic flux concentrator made of a magnetically permeable material and situated on the side of the first surface on the circuit board opposite to the Hall sensor component, wherein the first magnetic flux concentrator has a first lateral surface which faces away from the circuit board and includes a first surface area and a second lateral surface which faces toward the circuit board and includes a second surface area, and wherein the first surface area is greater than the second surface area;
   wherein the second surface area of the second lateral surface of the magnetic flux concentrator facing toward the circuit board corresponds to the surface area of the active sensor area of the Hall sensor, and
   wherein the first magnetic flux concentrator is fastened on the first surface of the circuit board using solder contacts.

5. A magnetic field sensor, comprising:
   a circuit board having a first surface, a second surface opposite to the first surface, and a recess extending from the first surface to the second surface;
   a Hall sensor component having a housing and at least one Hall sensor situated in the housing, wherein the Hall sensor has an active sensor area which is situated parallel to the first surface and in the area of the recess on the side of the second surface on the circuit board; and
   a first magnetic flux concentrator made of a magnetically permeable material and situated on the side of the first surface on the circuit board opposite to the Hall sensor component, wherein the first magnetic flux concentrator has a first lateral surface which faces away from the circuit board and includes a first surface area and a second lateral surface which faces toward the circuit board and includes a second surface area, and wherein the first surface area is greater than the second surface area,
   wherein the first magnetic flux concentrator has a trapezoidal cross-sectional area; and
   a second magnetic flux concentrator made of a magnetically permeable material and situated on the side of the second surface on the circuit board in such a way the Hall sensor component is situated along the extension of the recess between the first magnetic flux concentrator and the second magnetic flux concentrator, wherein the second magnetic flux concentrator has a third lateral surface which faces away from the circuit board and includes a third surface area and a fourth lateral surface which faces toward the circuit board and includes a fourth surface area, and wherein the third surface area is greater than the fourth surface area.

6. A method for manufacturing a magnetic field sensor, the method comprising:
   mounting a Hall sensor component, which has a housing and at least one Hall sensor situated in the housing, on a circuit board having a first surface, a second surface opposite to the first surface, and a recess extending from the first surface to the second surface, wherein the Hall sensor component is mounted in the area of the recess on the side of the second surface; and
   mounting a first magnetic flux concentrator made of a magnetically permeable material on the side of the first surface on the circuit board opposite to the Hall sensor component, wherein the magnetic flux concentrator has a first lateral surface which faces away from the circuit board and includes a first surface area and a second lateral surface which faces toward the circuit board and includes a second surface area, and wherein the first magnetic flux concentrator has a cross-sectional area which corresponds to a longitudinal section through one half of a single-sheet hyperboloid.

7. A method for manufacturing a magnetic field sensor, the method comprising:
   mounting a Hall sensor component, which has a housing and at least one Hall sensor situated in the housing, on a circuit board having a first surface, a second surface opposite to the first surface, and a recess extending from the first surface to the second surface, wherein the Hall sensor component is mounted in the area of the recess on the side of the second surface;
   mounting a first magnetic flux concentrator made of a magnetically permeable material on the side of the first surface on the circuit board opposite to the Hall sensor component, wherein the magnetic flux concentrator has a first lateral surface which faces away from the circuit board and includes a first surface area and a second lateral surface which faces toward the circuit board and includes a second surface area, and wherein—the first surface area is greater than the second surface area; and
   mounting a second magnetic flux concentrator made of a magnetically permeable material on the side of the second surface on the circuit board in such a way the Hall sensor component is situated along the extension of the recess between the first magnetic flux concentrator and the second magnetic flux concentrator, wherein the second magnetic flux concentrator has a third lateral surface which faces away from the circuit board and includes a third surface area and a fourth lateral surface which faces toward the circuit board and includes a fourth surface area, and wherein the third surface area is greater than the fourth surface area.

8. The magnetic field sensor as recited in claim 1, wherein the second surface area of the second lateral surface of the magnetic flux concentrator facing toward the circuit board corresponds to the surface area of the active sensor area of the Hall sensor.

9. The magnetic field sensor as recited in claim 8, wherein the Hall sensor component has at least two adjacent Hall sensors situated along the second surface of the circuit board, and wherein the lateral surface of the first magnetic flux concentrator facing toward the circuit board is situated above the active sensor area of one of the two Hall sensors.

10. The magnetic field sensor as recited in claim 8, wherein the first magnetic flux concentrator is fastened on the first surface of the circuit board using solder contacts.

11. The magnetic field sensor as recited in claim 1, further comprising:
   a second magnetic flux concentrator made of a magnetically permeable material and situated on the side of the second surface on the circuit board in such a way the Hall sensor component is situated along the extension of the recess between the first magnetic flux concentrator and the second magnetic flux concentrator, wherein the second magnetic flux concentrator has a third lateral surface which faces away from the circuit board and includes a third surface area and a fourth lateral surface which faces toward the circuit board and includes a fourth surface area, and wherein the third surface area is greater than the fourth surface area.

* * * * *